(12) United States Patent
Tanaka et al.

(10) Patent No.: US 8,778,092 B2
(45) Date of Patent: Jul. 15, 2014

(54) SUBSTRATE PROCESSING APPARATUS, SUBSTRATE PROCESSING METHOD AND STORAGE MEDIUM

(75) Inventors: Hiroshi Tanaka, Kumamoto (JP);
Hironobu Hyakutake, Kumamoto (JP);
Takashi Uno, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 299 days.

(21) Appl. No.: 13/042,645

(22) Filed: Mar. 8, 2011

(65) Prior Publication Data

US 2011/0220153 A1 Sep. 15, 2011

(30) Foreign Application Priority Data

Mar. 9, 2010 (JP) .................. 2010-052305
Dec. 28, 2010 (JP) .................. 2010-293024

(51) Int. Cl.
*B08B 3/04* (2006.01)
*B08B 5/02* (2006.01)
*F26B 5/00* (2006.01)

(52) U.S. Cl.
USPC .................. 134/30; 134/32; 34/487

(58) Field of Classification Search
USPC .................. 134/26, 30, 31, 32
See application file for complete search history.

(56) References Cited

U.S. PATENT DOCUMENTS

| | | | | |
|---|---|---|---|---|
| 5,938,857 A | * | 8/1999 | Fujiwara et al. | 134/2 |
| 6,625,901 B1 | * | 9/2003 | Mehmandoust et al. | 34/476 |
| 2002/0017315 A1 | * | 2/2002 | Kamikawa et al. | 134/61 |
| 2002/0174882 A1 | * | 11/2002 | Kimura | 134/21 |
| 2006/0151006 A1 | * | 7/2006 | Nam et al. | 134/26 |
| 2007/0113423 A1 | * | 5/2007 | Tanaka et al. | 34/486 |

FOREIGN PATENT DOCUMENTS

| | | |
|---|---|---|
| JP | 03-169013 A | 7/1991 |
| JP | 2000-277481 A | 10/2000 |
| JP | 2002-280352 A | 9/2002 |
| JP | 2006-289219 A | 10/2006 |
| JP | 2007-005478 A | 1/2007 |
| JP | 2007-165833 A | 6/2007 |

* cited by examiner

*Primary Examiner* — Michael Kornakov
*Assistant Examiner* — Natasha Campbell
(74) *Attorney, Agent, or Firm* — Pearne & Gordon LLP

(57) ABSTRACT

There is provided a substrate processing method including cleaning a substrate by immersing the substrate in a cleaning solution in a longitudinal direction while the cleaning solution is supplied to a cleaning tank; transferring the substrate picked up from the cleaning tank to a drying chamber while holding the substrate in a longitudinal direction; and drying the substrate in the drying chamber communicating with an upper area of the cleaning tank by alternately supplying a first drying gas containing vapor of a solvent for removing a liquid and a second drying gas without containing the vapor of the solvent for removing the liquid to an area where the substrate is exposed between the upper area of the cleaning tank and the drying chamber after an upper end of the cleaned substrate is picked up from a liquid surface of the cleaning solution.

13 Claims, 10 Drawing Sheets

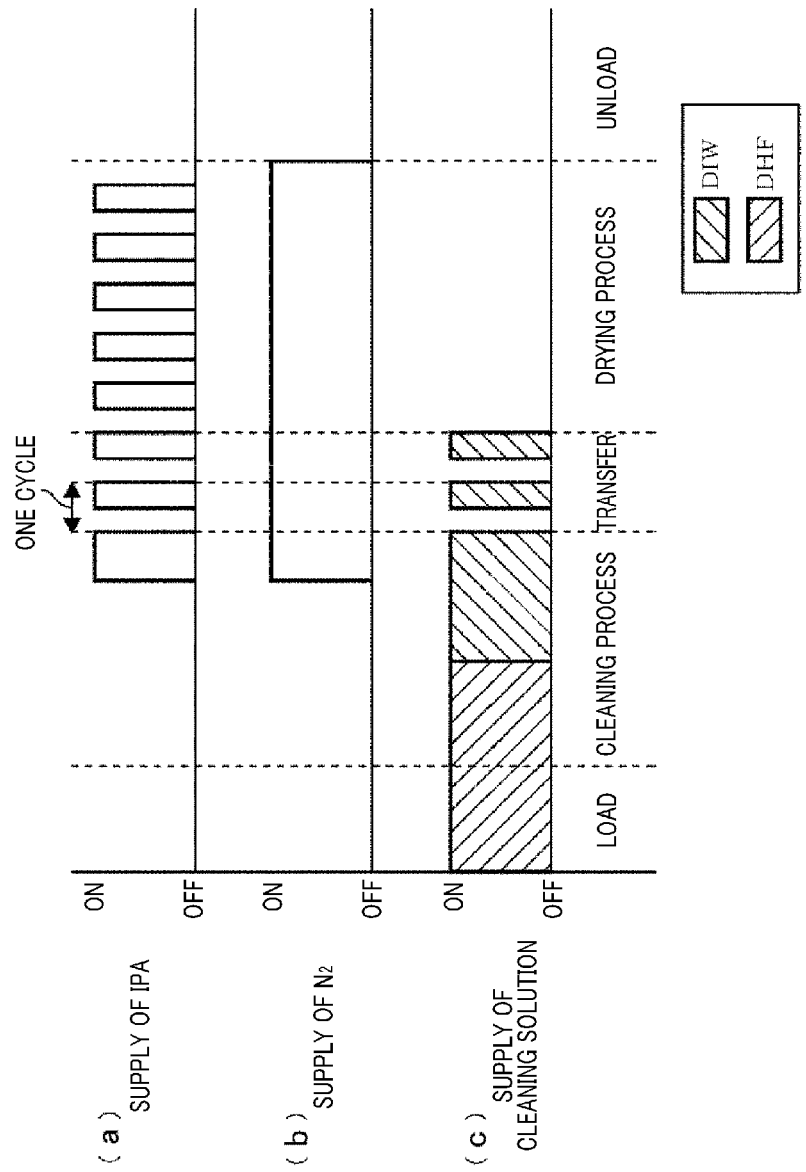

SUBSTRATE PROCESSING APPARATUS, SUBSTRATE PROCESSING METHOD AND STORAGE MEDIUM

CROSS-REFERENCE TO RELATED APPLICATION

This application claims the benefit of Japanese Patent Application No. 2010-052305 filed on Mar. 9, 2010 and Japanese Patent Application No. 2010-293024 filed on Dec. 28, 2010, the entire disclosures of which are incorporated herein by reference.

FIELD OF THE INVENTION

The present disclosure relates to a technology for performing cleaning and drying processes to a target substrate such as a semiconductor wafer.

BACKGROUND OF THE INVENTION

Various contaminants generated in a semiconductor device manufacturing process adhere to a surface of a target substrate such as a semiconductor wafer (hereinafter, referred to as "wafer"), and in order to remove the contaminants, there has been performed a cleaning process for cleaning the surface of the wafer by using a multiple number of cleaning solutions.

By way of example, in a substrate processing apparatus which performs a batch type cleaning process, there has been widely employed a cleaning method in which for example, several tens of wafers are immersed in sequence in a cleaning solution such as a chemical solution or a rinse solution in a processing tank. After the cleaning process, the wafers are picked up from the cleaning solution and then a drying gas including vapor of a solvent such as IPA (isopropyl alcohol) is injected to remove a liquid (for example, water) from the surface of the wafer and prevent generation of water marks.

In the semiconductor device manufacturing process, a stacked structure is formed on the surface of the wafer by photolithography, and, thus, a pattern made of materials including an organic material, such as a resist film, is formed on the surface of the cleaning target wafer. Recently, as a wiring structure in a semiconductor device becomes miniaturized, such a pattern also becomes miniaturized, so that its mechanical strength or chemical resistance may be decreased as compared with a conventional one.

If the drying gas including the solvent such as IPA is brought into contact with such a resist film, for example, a trench pattern 80 shown in FIG. 13A may be deformed into a taper pattern 81, a collapsed pattern 82, a disappeared pattern 83 or dissolved pattern 84 as depicted in FIG. 13B. In a manufacturing process of such a miniaturized semiconductor device, such a deformation may be a big problem in improving product yield.

In the semiconductor device manufacturing process, a wafer is transferred while its peripheral area, on which a semiconductor device is not formed, is held or grasped by a transfer arm or tweezers. For this reason, more particles adhere to the peripheral area of the wafer than its central area and non-removed particles may remain on the peripheral area even after a cleaning process.

Meanwhile, in the batch type cleaning process, a wafer may be immersed in the cleaning solution in a longitudinal direction and picked up from the cleaning solution in the longitudinal direction and then dried. In this case, if the wafer is brought into contact with IPA vapor, the IPA may be adsorbed to water on the surface of the wafer and a liquid film mixed with the water and the IPA may be formed and may flow down the surface of the wafer by a decrease in surface tension or weight of the liquid film. The present inventors have found that relatively many particles remaining in a peripheral area of the wafer flow toward a central area of the wafer along the flow of the liquid film and contaminate an area where the semiconductor device is formed.

In Patent Document 1, it is disclosed that vapor of a drying fluid such as IPA is supplied in advance to an upper region of a cleaning solution such as pure water in which a wafer is immersed and an atmosphere around the wafer is slowly and directly changed from the cleaning solution to the IPA vapor so as to dry the wafer. However, even in this case, if the IPA as the drying fluid is supplied in large quantities, there is the same problem as the above-described drying method in which the wafer is picked up and then the IPA vapor is supplied to the wafer. By way of example, a liquid film of the IPA condensed on the surface of the wafer may flow down the surface of the wafer together with particles and may contaminate an area where a semiconductor device is formed.

Patent Document 1: Japanese Patent No. H06-103686 (see claim 1 and Lines 39 to 43 of the left column of page 4)

BRIEF SUMMARY OF THE INVENTION

The present disclosure has been conceived in view of the foregoing circumstances and provides a substrate processing apparatus capable of performing cleaning and drying processes well while reducing effects on a target substrate, and further provides a substrate processing method and a storage medium that stores the same method.

In accordance with one aspect of the present disclosure, there is provided a substrate processing method including: cleaning a target substrate by immersing the target substrate in a cleaning solution in a longitudinal direction while the cleaning solution is supplied to a cleaning tank; transferring the target substrate picked up from the cleaning tank to a drying chamber while holding the target substrate in a longitudinal direction; and drying the target substrate in the drying chamber communicating with an upper area of the cleaning tank by alternately supplying a first drying gas containing vapor of a solvent for removing a liquid and a second drying gas without containing the vapor of the solvent for removing the liquid to an area where the target substrate is exposed between the upper area of the cleaning tank and the drying chamber after an upper end of the cleaned target substrate is picked up from a liquid surface of the cleaning solution.

The substrate processing method may include the following features.

(a) The substrate processing method may further include supplying the first drying gas and the second drying gas alternately to the upper area of the cleaning tank from a time when the entire target substrate is immersed in the cleaning solution.

(b) The substrate processing method may further include supplying a cleaning solution into the cleaning tank based on an operation of supplying the first drying gas to the upper area of the cleaning tank.

(c) A speed of picking up the target substrate from the cleaning solution may be in a range of from about 2 mm/sec to about 10 mm/sec.

(d) When a cycle is defined as a period of time required to respectively supply the first drying gas and the second drying gas one time, at least one cycle may be repeated between a time when the upper end of the target substrate is picked up from the cleaning solution and a time when the whole target substrate is picked up from the cleaning solution.

(e) A resist pattern for a KrF excimer laser exposure may be formed on the target substrate, and the first drying gas may be a mixed gas containing isopropyl alcohol of a concentration ranging from about 60 volumetric ppm to about 240 volumetric ppm in a nitrogen gas as a carrier gas at standard temperature and standard pressure, and the second drying gas may be a nitrogen gas.

(f) A supply time ratio of the first drying gas and the second drying gas may be in a range of from about 1:1 to about 1:10.

(g) A supply amount of the nitrogen gas may be in a range of from about 100 liters/min to about 200 liters/min at standard temperature and pressure.

In accordance with another aspect of the present disclosure, there is provided a substrate processing method including: cleaning a target substrate by immersing the target substrate in a cleaning solution in a longitudinal direction while the cleaning solution is supplied to a cleaning tank; transferring the target substrate picked up from the cleaning tank to a drying chamber while holding the target substrate in a longitudinal direction; supplying a first gas containing vapor of a solvent of a first concentration to an area where the target substrate is exposed between an upper area of the cleaning tank and the drying chamber in order to form a liquid film on a surface of the target substrate after an upper end of the cleaned target substrate is picked up from a liquid surface of the cleaning solution; and supplying a second gas containing the vapor of the solvent of a second concentration higher than the first concentration after the target substrate is loaded into the drying chamber communicating with the upper area of the cleaning tank in order to remove the liquid by vaporizing the solvent after the liquid adhering to the surface of the substrate is diluted by condensing the solvent.

The substrate processing method may include the following features.

(h) In the supplying process of the first gas and the supplying process of the second gas, the first concentration may be changed to the second concentration by changing an interval of alternate supplies of a gas containing the vapor of the solvent and a gas without containing the vapor of the solvent.

(i) The supplying process of the second gas may continuously supply the gas containing the vapor of the solvent instead of alternately supplying the gas containing the vapor of the solvent and the gas without containing the vapor of the solvent.

(j) In the supplying process of the first gas and the supplying process of the second gas, the first concentration may be changed to the second concentration by changing a mixing ratio of the vapor of the solvent and a gas that dilutes the vapor of the solvent.

(k) In the supplying process of the first gas and the supplying process of the second gas, a supply amount of a gas containing vapor of a solvent of a preset concentration may be changed so that a concentration of the vapor of the solvent is changed to the first concentration or the second concentration in an atmosphere where the gas is supplied.

In accordance with the present disclosure, the drying process is performed on the target substrate by alternately supplying the first drying gas containing vapor of the solvent for removing a liquid and the second drying gas without containing vapor of the solvent to the area where the target substrate is exposed after the cleaned target substrate is picked up from the cleaning solution. Accordingly, removal of the liquid from the surface of the wafer W by the vapor of the solvent can be performed alternately with the evaporation of the solvent. Consequently, the concentration of the solvent on the surface of the target substrate becomes low, and, thus, generation of water marks can be reduced while suppressing effects on a pattern formed on the surface of the target substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 7 is an explanatory diagram showing a sequence of supply of a drying gas and a cleaning solution to the cleaning/drying unit;

DETAILED DESCRIPTION OF THE INVENTION

Figure 1:
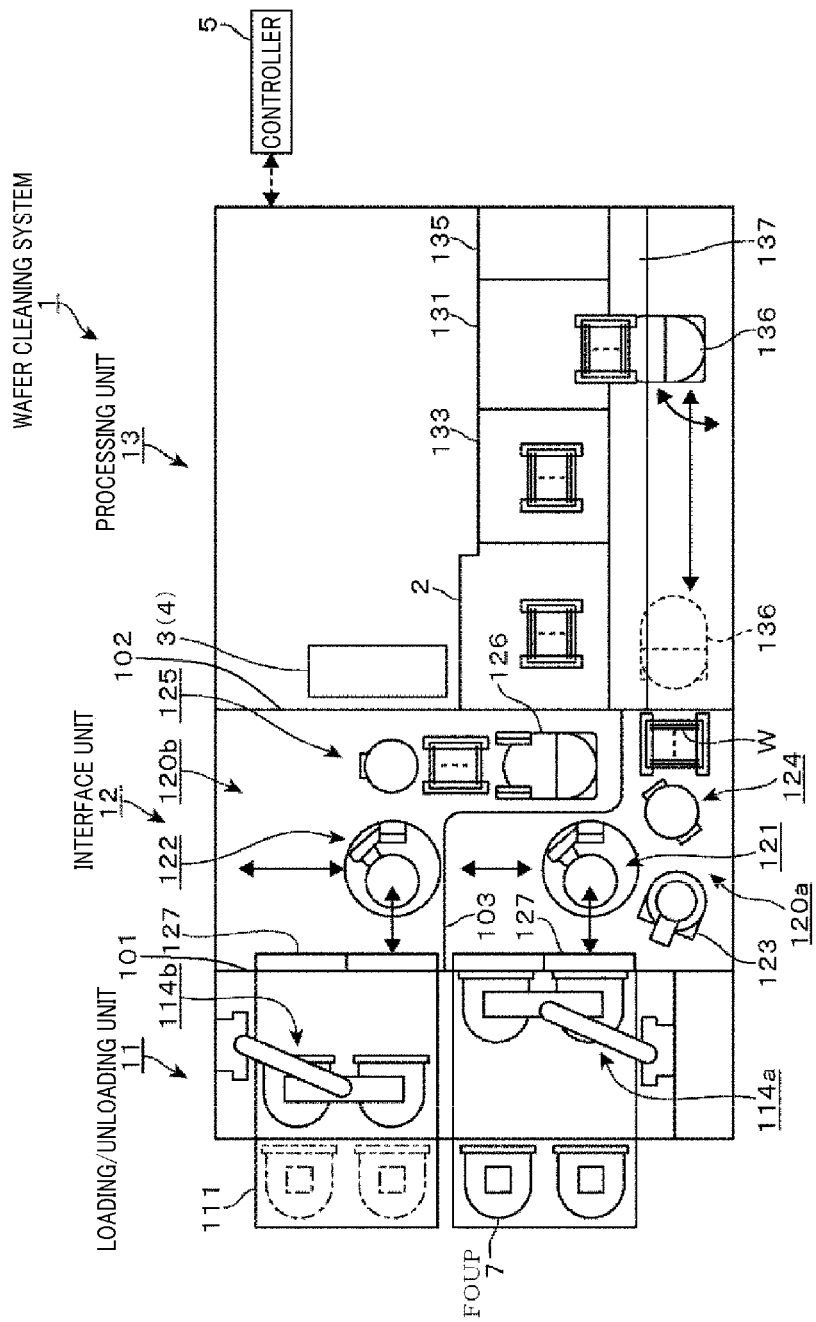
FIG. 1 is a transversal plane view of a wafer cleaning system in accordance with an embodiment.
Figure 2:
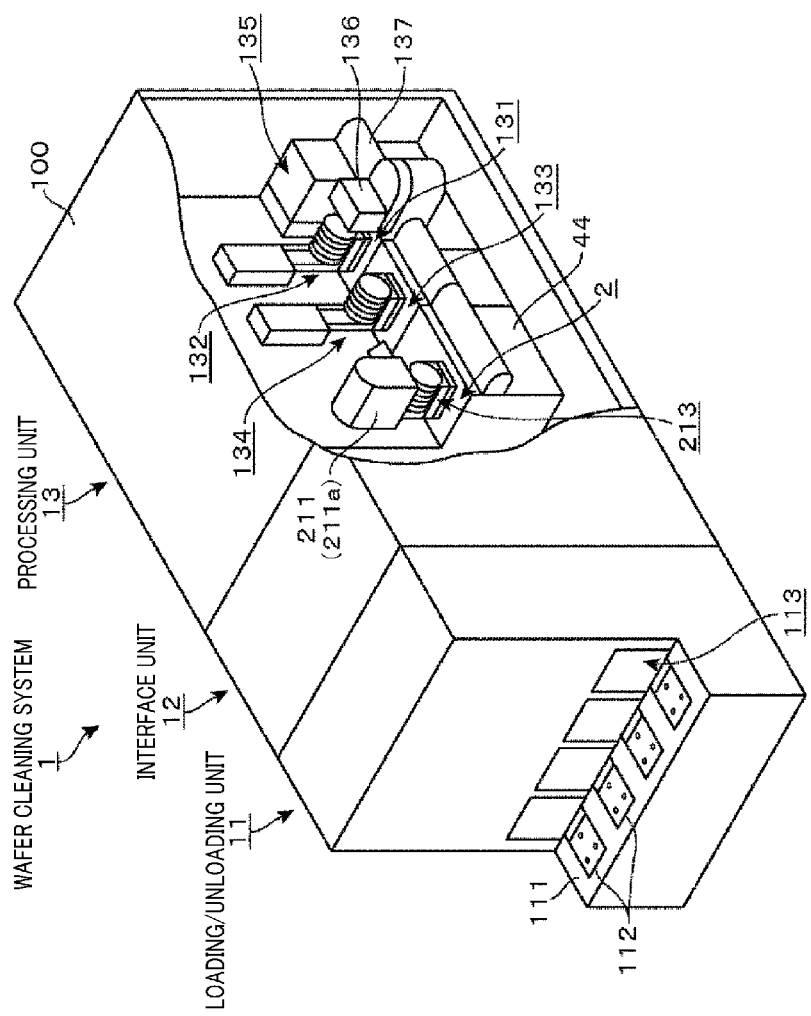
FIG. 2 is a partially broken perspective view showing an internal configuration of the wafer cleaning system.

Prior to explanation of a cleaning/drying unit 2 as a substrate processing apparatus in accordance with the present disclosure, an outline of a wafer cleaning system 1 including the cleaning/drying unit 2 will be explained briefly. FIG. 1 is a plane view of the wafer cleaning system 1 in accordance with the present embodiment, and FIG. 2 is a partially broken perspective view thereof. When the left side of each drawing is defined as the front side, the wafer cleaning system 1 may include a loading/unloading unit 11 that loads and unloads FOUPs 7 with respect to a housing 100; an interface unit 12 that adjusts a position of a wafer W or changes a posture of the wafer W when the wafer W is delivered between the FOUP 7 loaded into the loading/unloading unit 11 and a processing unit 13 as a rear part; and the processing unit 13 that performs a liquid process and a drying process onto the wafer W. Here, the loading/unloading unit 11, the interface unit 12 and the processing unit 13 are provided in this sequence from the front side.

On the foremost side of the wafer cleaning system 1 in accordance with the present embodiment, a load port 111 capable of mounting, for example, four FOUPs 7 thereon is installed. By way of example, when viewed from the front side, two mounting tables 112 on the right side are used for loading the FOUPs 7 into the wafer cleaning system 1 and two mounting tables 112 on the left side are used for unloading the FOUPs 7 from the wafer cleaning system 1. By way of example, if a FOUP 7 containing a multiple number of wafers W is mounted on the mounting table 112 for loading by an external transfer device or the like, the mounting table 112 slides backward and the FOUP 7 is loaded into the housing 100. The FOUP 7 loaded into the housing 100 is transferred between the surface of the mounting table 112 sliding into the loading/unloading unit 11, an access position to the interface unit 12 as a rear part, and a non-illustrated stocking space for an empty FOUP 7 by, for example, lifters 114a and 114b installed at both sidewalls within the loading/unloading unit 11.

The interface unit 12 is a space formed by partitioning an inner space of the housing 100 of the wafer cleaning system 1 from the loading/unloading unit 11 and the processing unit 13 by partition walls 101 and 102. Further, the interface unit 12 is divided by a partition wall 103 into a first interface room 120a for loading the wafer W and a second interface room 120b for unloading the wafer W. When the FOUP 7 is placed at the access position, a cover provided at side surfaces of the FOUP 7 is separated by an opening/closing door 127 provided at an opening of the partition wall 101. Then, the wafer W within the FOUP 7 is taken out by a wafer taking-out arm 121 and loaded into the first interface room 120a.

With respect to wafers W taken out from the FOUP 7, their notch positions are detected and adjusted between the wafers W by a notch aligner 123, so that positions of the wafers W are aligned. Further, the wafers W are arranged in a horizontal direction as in a shelf by a first posture changing device 124 and then rotated about 90 degrees to have a vertical posture. Thereafter, these wafers W are delivered to a transfer arm 136 of the processing unit 13, and the transfer arm 136 transfers, for example, fifty wafers W.

Meanwhile, in the second interface room 120b for unloading, the wafers W transferred by the transfer arm 136 after the cleaning and drying processes in the processing unit 13 are delivered to a second posture changing device 125 via a delivery arm 126. The wafers W arranged in the vertical posture are changed to have horizontal postures by the second posture changing device 125, and then the wafers W are accommodated into the FOUP 7 on the side of the loading/unloading unit 11 by a wafer receiving arm 122.

The wafer W transferred to the transfer arm 136 of the processing unit 13 is transferred within the processing unit 13 by the transfer arm 136 moving along a transfer rail 137 in a forward/backward direction. Then, in a first processing unit 131 as a processing tank filled with, for example, APM (Ammonium hydroxide-hydrogen Peroxide-Mixture) solution (i.e., a mixed solution of ammonia, hydrogen peroxide, and pure water), the wafer is immersed in this chemical solution, so that particles or organic contaminants adhering to the wafer W are removed. Thereafter, the wafer W is transferred to a second processing unit 133 as a processing tank filled with, for example, HPM (HCl-hydrogen Peroxide-Mixture) solution (i.e., a mixed solution of hydrochloric acid, hydrogen peroxide, and pure water) and immersed in this chemical solution, so that metal contaminants adhering to the wafer W are removed. Between these processing units 131 and 133 and the transfer arm 136, the wafers W are delivered via wafer boats 132 and 134 at one time. A reference numeral 135 of FIG. 2 denotes a chuck cleaning unit for cleaning a chuck provided at the transfer arm 136 to hold a wafer.

Figure 3:
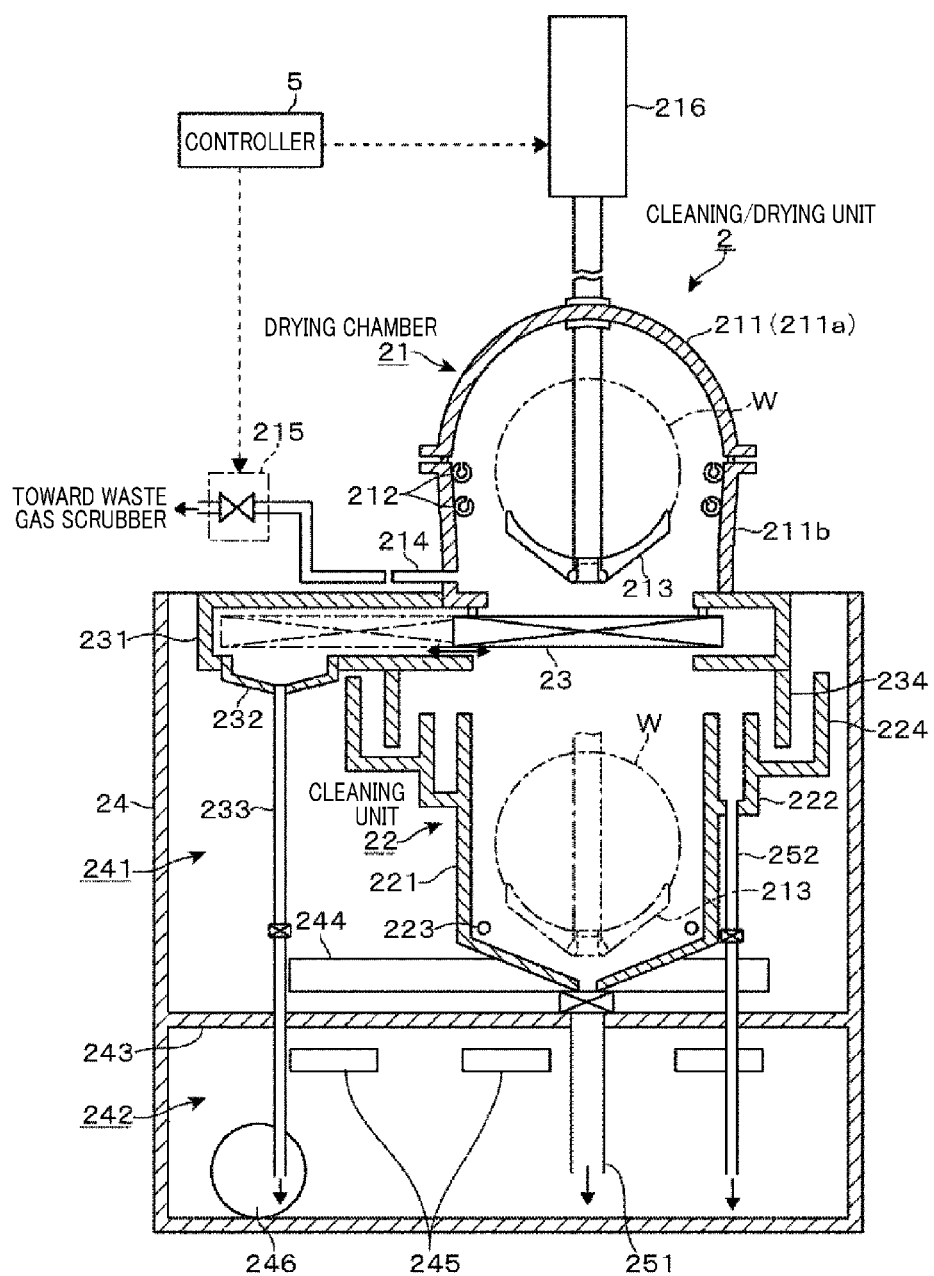
FIG. 3 is a longitudinal cross sectional view of a cleaning/drying unit installed in the wafer cleaning system.

The wafer W on which various cleaning processes are performed is transferred by the transfer arm 136 to the cleaning/drying unit 2 as a substrate processing apparatus in accordance with the present disclosure. Hereinafter, a detailed configuration of the cleaning/drying unit 2 will be explained. The cleaning/drying unit 2 consecutively performs two processes in a single unit. The two processes may include a cleaning process for cleaning the wafer W by pure water after a chemical oxide film formed on a surface of the wafer W is removed by a chemical solution such as hydrofluoric acid; and a drying process for drying a liquid adhering to the surface of the wafer W by a drying gas including IPA vapor or a nitrogen gas. FIG. 3 shows a longitudinal cross sectional view of the cleaning/drying unit 2 when viewed from the transfer arm 136.

The cleaning/drying unit 2 may include a cleaning unit 22 for containing a cleaning solution such as pure water or a chemical solution, for example, hydrofluoric acid; a drying chamber 21 provided above the cleaning unit 22 so as to communicate with an upper region of an inner tank 221 within the cleaning unit 22; a shutter 23 configured to open and close a communication region between the drying chamber 21 and the cleaning unit 22; and a wafer boat 213 serving as a substrate holder that vertically transfers a multiple number of, for example, fifty wafers W between the inside of the cleaning unit 22 and the inside of the drying chamber 21 while holding these wafers W in a vertical posture (i.e., in a longitudinal direction). A reference numeral 216 of FIG. 3 denotes an elevating mechanism that elevates the wafer boat 213 in response to a control signal from a controller 5 to be described later.

The cleaning unit 22 is made of, for example, quartz or polypropylene. The cleaning unit 22 may include the inner tank 221 having an open top and serving as a cleaning tank of the present embodiment; an outer tank 222 provided at an outer periphery of an upper end portion of the inner tank 221 and configured to receive a cleaning solution overflowing from the inner tank 221; a liquid sealing wall 224 provided at an outer periphery of the outer tank 222 and configured to separate an inner space of the cleaning unit 22 from an inner space of a housing 24 covering the entire cleaning unit 22; and liquid supply nozzles 223 provided at both sides of a lower portion in the inner tank 221 in FIG. 3 and configured to inject a cleaning solution supplied from a cleaning solution supply unit toward the wafer W within the inner tank 221. A reference numeral 251 of FIG. 3 denotes a first liquid drain path provided at a bottom of the inner tank 221 and a reference numeral 252 denotes a second liquid drain path provided at a bottom of the outer tank 222, and opening/closing valves are respectively provided on liquid drain paths 251 and 252. Further, provided at a bottom of the liquid sealing wall 224 is a non-illustrated liquid drain path for draining a liquid when the liquid-sealing function is not required.

The inner tank 221 is provided in the housing 24 covering the entire inner tank 221, and the housing 24 is provided in front of the second processing unit 133 as depicted in FIGS. 1 and 2. The housing 24 is vertically divided into an upper space 241 and a lower space 242 by a partition plate 243. The upper space 241 is a space for accommodating the cleaning unit 22 and the lower space 242 is a space for draining a liquid from the liquid drain paths 251, 252 and 233 to the outside of the cleaning/drying unit 2. In FIG. 3, reference numerals 244 and 245 denote gas exhaust windows installed in the upper space 241 and the lower space 242, respectively, and reference numeral 246 denotes a waste liquid outlet formed in the lower space 242.

The drying chamber 21 may include a hood-shaped drying chamber main body 211. The drying chamber main body 211 has an open bottom and U-shaped longitudinal cross section, and the drying chamber main body 211 is made of, for example, quartz or polypropylene. Further, the drying chamber 21 is provided above the cleaning unit 22 such that a bottom opening is positioned to face a top opening of the cleaning unit 22 so as to form a communication region. The drying chamber main body 211 is vertically divided into, for example, a base body 211b as a base part fixed to the housing 24 and a cover body 211a as an upper part mounted on the base body 211b. The cover body 211a is configured to be vertically movable by a non-illustrated elevating mechanism, and by moving the cover body 211a upward, the wafer W transferred by the transfer arm 136 can be loaded into the cleaning/drying unit 2.

At an upper portion of the base body 211b of the drying chamber 21, for example, near a position where the base body 211b is separated from the cover body 211a, there are provided, for example, two sets of drying vapor supply nozzles 212 having a multiple number of supply holes opened upward, for example, to supply a drying gas into the drying chamber 21. Further, by way of example, at a base end of the base body 211b, there is provided a gas exhaust line 214 for exhausting the drying gas from the drying chamber 21 toward, for example, an external waste gas scrubber. A reference numeral 215 of FIG. 3 denotes a gas exhaust controller such as a control valve that controls an exhaust amount of the drying gas from the drying chamber 21 in response to a control signal from the controller 5 to be described later.

The wafer boat 213 within the cleaning/drying unit 2 is configured to be vertically movable between a delivery position of the wafer W with respect to the transfer arm 136, a drying position in the drying chamber 21, and a cleaning position in the cleaning unit 22 by the elevating mechanism 216. In FIG. 3, the wafer boat 213 is illustrated by a solid line at the drying position and by a dashed dotted line at the cleaning position.

Further, in the middle position between the drying chamber 21 and the cleaning unit 22 having the openings communicating with each other, there is provided the shutter 23 configured to open and close the communication region between the drying chamber 21 and the cleaning unit 22 by moving, for example, from side to side in a horizontal direction in FIG. 3. In FIG. 3, a reference numeral 231 denotes a container to which the shutter 23 retreats when the communication region is opened; a reference numeral 232 denotes a liquid storage that receives the cleaning solution dripping from the shutter 23; and a reference numeral 233 denotes a liquid drain path equipped with an opening/closing valve for draining the cleaning solution stored in the liquid storage 232. Further, a reference numeral 234 denotes a leakage preventing wall inserted into the liquid sealing wall 224 in order to prevent a gas leakage in the liquid sealing wall 224.

Figure 4:
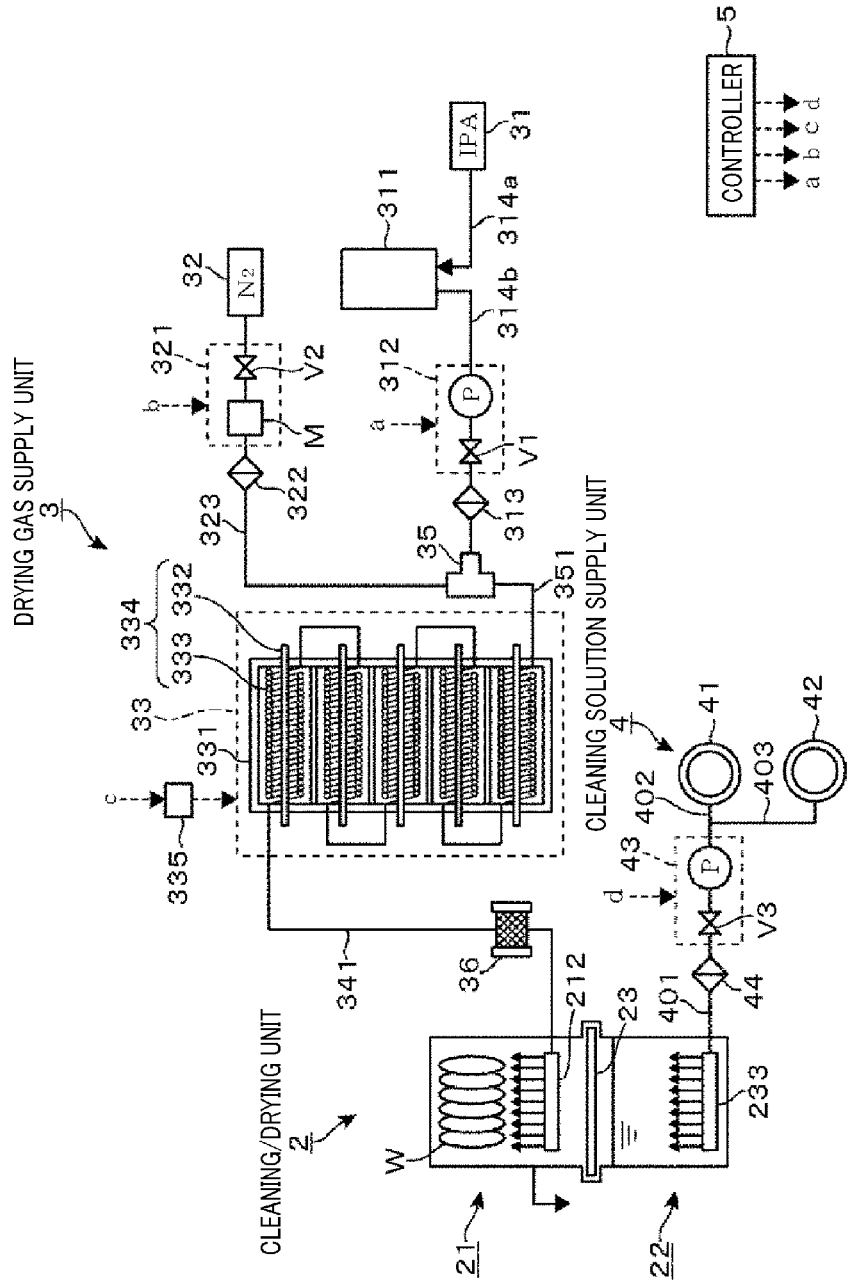
FIG. 4 is an explanatory diagram showing a configuration of a drying gas supply unit of the cleaning/drying unit.

FIG. 4 shows a configuration of a drying gas supply unit 3 that supplies a gas for drying the wafer W to the drying chamber 21 and a configuration of a cleaning solution supply unit 4 that supplies a cleaning solution to the cleaning unit 22. The drying gas supply unit 3 supplies a mixed gas of IPA vapor and a nitrogen gas (first drying gas) from IPA and the nitrogen gas as an inert gas each supplied from a IPA supply system and a nitrogen gas supply system in order to remove water (liquid) adhering to the surface of the wafer W. Further, the drying gas supply unit 3 supplies a single nitrogen gas (second drying gas) for evaporating the IPA carrying the water from the surface of the wafer W to the drying chamber 21. Therefore, the drying gas supply unit 3 in accordance with the present embodiment serves as a first drying gas supply unit for supplying the first drying gas and also serves as a second drying gas supply unit for supplying the second drying gas. The drying gas supply unit 3 is provided, for example, on the side of a rear surface of the cleaning/drying unit 2 as depicted in FIG. 1.

The drying gas supply unit 3 may include a gas generation unit 33 that generates the first drying gas by evaporating the IPA from a mixed fluid of a nitrogen gas and IPA mist. The gas generation unit 33 is connected with the IPA supply system and the nitrogen supply system. The IPA supply system may include an IPA tank 311 as an intermediate tank for receiving a liquid (IPA) from an external IPA supply source 31 and temporarily storing the liquid (IPA); a supply controller 312 for delivering a predetermined amount of liquid (IPA) from the IPA tank 311 to a downstream side; and a filter 313 for removing particles contained in the liquid (IPA). The IPA tank 311, the supply controller 312 and the filter 313 are provided in this sequence on IPA supply lines 314a and 314b. As depicted in FIG. 4, the supply controller 312 of the IPA supply system may include, for example, a reciprocating pump P and an opening/closing valve V1.

Meanwhile, the nitrogen supply system may include a supply controller 321 for receiving a predetermined amount of nitrogen gas from, for example, an external nitrogen supply source 32; and a filter 322 for removing particles contained in the nitrogen gas. The supply controller 321 and the filter 322 are provided in this sequence on a part of a nitrogen supply line 323. The supply controller 321 may include an opening/closing valve V2 and a mass flow controller M. The IPA supply line 314b and the nitrogen supply line 323 are connected with a common two-fluid nozzle 35, so that the mixed fluid of the nitrogen gas and the IPA mist obtained by spraying the liquid (IPA) in mist form into a nitrogen gas atmosphere flowing in the two-fluid nozzle 35 can be discharged toward the gas generation unit 33 as a rear part through a mixed fluid supply line 351.

The gas generation unit 33 heats the mixed fluid of the nitrogen gas and mist of the IPA supplied from the two-fluid nozzle 35 and generates a mixed gas of IPA vapor and a nitrogen gas serving as the first drying gas. The gas generation unit 33 may include a main body container 331 divided into, for example, five small rooms. In each room, there is provided a heating unit 334 for heating the mixed fluid of the IPA and the nitrogen gas. Each heating unit 334 may include a halogen lamp 332 formed into, for example, a straight rod shape; and a spiral tube 333 positioned around the halogen lamp 332 so as to be spaced apart from the halogen lamp 332 in a diametric direction and extended in a spiral shape in a longitudinal direction of the halogen lamp 332.

The spiral tube 333 is formed of a stainless steel pipe painted, for example, black to make it easy to absorb radiant heat from the halogen lamp 332. Further, the spiral tube 333 is formed into a spiral shape such that adjacent lines arranged in the longitudinal direction are brought into contact with each other, and, thus, it is difficult for radiant heat from the halogen lamp 332 to leak through a gap between the lines of the spiral tube 333 to the outside. Further, since a nitrogen gas is supplied to each room of the main body container 331 from a non-illustrated nitrogen gas supply source, it is possible to prevent penetration of IPA vapor to the heating atmosphere from an external atmosphere.

The spiral tubes 333 of the heating units 334 are connected in series with each other so as to form a single flow path through which the mixed fluid flows. Further, one end on an upstream side is connected with the mixed fluid supply line 351 and the other end on a downstream side is connected with an IPA vapor supply line 341 for supplying IPA vapor to the drying chamber 21. For example, among five heating units 334 arranged in series, two heating units 334 on the upstream side evaporate mist of the IPA of the mixed fluid. The other three heating units 334 prevent condensation of the IPA by increasing a temperature of the first drying gas, i.e., the mixed fluid of the nitrogen gas and the IPA vapor obtained by evaporating the IPA, so as to allow the temperature to be in a range of about 150° C. to about 200° C., for example, about 190° C. higher than the dew point of the IPA vapor such that the first drying gas is overheated. The first drying gas generated as described above is discharged to the drying gas supply nozzles 212 within the drying chamber 21 through the IPA vapor supply line 341. A reference numeral 36 of FIG. 4 denotes a metal filter for removing particles contained in the drying gas.

In each heating unit 334 of the gas generation unit 33, a non-illustrated temperature detector is provided, and, thus, for example, an outlet temperature of the mixed fluid flowing through each spiral tube 333 can be detected. Further, such a temperature detection result may be outputted to the controller 5 to be described later and fed back to a power supply unit 335 for supplying power to each halogen lamp 332 as a control amount of supplied power and, thus, a temperature control of each heating unit 334 is performed.

By way of example, if a pattern of a resist film for a KrF excimer laser exposure is formed on the surface of the wafer W, nitrogen in a range of about 100 liters/min to about 200 liters/min, for example, about 120 liters/min, is supplied from the nitrogen supply system at, e.g., a standard temperature and pressure (0° C., 1 atm) and likewise, IPA vapor in a range of about 0.2 cc/sec to about 0.4 cc/sec, for example, about 0.2 cc/sec, is supplied at a standard temperature and pressure.

The supply controller 312 of the IPA can start or stop the supply of the IPA to the two-fluid nozzle 35 in response to an instruction of the controller 5. If the supply of the IPA is stopped, only the nitrogen is continuously supplied to the gas generation unit 33 from the nitrogen supply system. Here, if the supply of the IPA is stopped and the nitrogen gas is supplied to the gas generation unit 33, a power from the power supply unit 335 is controlled based on a temperature detection result detected by the temperature detector of each heating unit 334. As a result, by way of example, the nitrogen having a temperature increased to the same level as a temperature of the first drying gas is transferred as a second drying gas to the drying gas supply nozzle 212 via the IPA vapor supply line 341. Here, a temperature of the second drying gas is not limited to the same level as the temperature of the first drying gas but may be higher or lower than the temperature of the first drying gas.

A component of the drying gas supply unit 3 for supplying the first drying gas is not limited to the gas generation unit 33 that includes the halogen lamps 332 and the spiral tubes 333 and is configured to mix mist of the IPA with the nitrogen serving as a carrier gas and heat the mixed fluid so as to render the IPA overheated. Any component can be employed if it is possible to switchably supply the first drying gas including the IPA vapor and the nitrogen and the second drying gas including the nitrogen. By way of example, the first drying gas may be generated by heating a mixed gas of IPA and a nitrogen gas obtained by making bubbles of nitrogen in a liquid (IPA) or may be generated by mixing IPA and nitrogen after a liquid (IPA) is heated and evaporated. In the former case, the second drying gas may be obtained by bypassing the liquid (IPA) and stopping making bubbles, and in the latter case, the second drying gas may be obtained by stopping mixing the IPA with the nitrogen.

Hereinafter, the cleaning solution supply unit 4 will be explained. In the cleaning solution supply unit 4, a first branch line 402 connected with a pure water, e.g., DIW (DeIonized Water) supply line 41 and a second branch line 403 connected with a DHF (Diluted Hydrogen Fluoride) supply line 42 are joined and connected with a common cleaning solution supply line 401. The DIW and the DHF are used as cleaning solutions in the present embodiment. The cleaning solution supply line 401 may include a supply controller 43 that transfers cleaning solutions received through each branch line 402 and 403 to the cleaning unit 22; and a filter 44 that removes particles contained in the cleaning solutions. Here, the supply controller 43 and the filter 44 are provided in this sequence from an upstream side. Further, the cleaning solutions supplied to the supply controller 43 are switched by a non-illustrated switching valve, so that it is possible to supply the DIW and the DHF to the cleaning unit 22 while switching them. The supply controller 43 may include, for example, a liquid pump P and an opening/closing valve V3. In the same manner as the drying gas supply unit 3, the cleaning solution supply unit 4 is provided, for example, on the side of the rear surface of the cleaning/drying unit 2 as depicted in FIG. 1.

The wafer cleaning system 1 configured as described above and the cleaning/drying unit 2 provided therein are connected with the controller 5 as depicted in FIGS. 1, 3, and 4. The controller 5 may be composed of a computer including, for example, a non-illustrated CPU and a memory. Stored in the storage unit is a program including a step (instruction) group for controlling an operation of the wafer cleaning system 1, i.e., an operation in which the FOUP 7 is loaded into the loading/unloading unit 11, the wafer W is taken out from the FOUP 7, various liquid and drying processes are performed on the wafer W, the wafer W is accommodated into the FOUP 7, and the FOUP 7 is unloaded from the loading/unloading unit 11. This program may be stored in a storage medium such as a hard disk, a compact disk, a magnet optical disk or a memory card and may be installed in the computer.

Further, stored in the storage unit (storage medium) of the controller 5 is a program for controlling a supply timing of a cleaning solution, a lifting speed of the wafer boat 213, a supply timing of first and second drying gases or a supply amount of first and second drying gases when a cleaning process is performed on a wafer W by a cleaning solution in the cleaning unit 22 of the cleaning/drying unit 2 and a drying process is performed on the wafer W picked up from the cleaning solution by a drying gas. Hereinafter, operations of cleaning and drying processes for the wafer W performed by the cleaning/drying unit 2 based on these programs will be explained.

The wafer W taken out from the FOUP 7 loaded into the loading/unloading unit 11 of the wafer cleaning system 1 is transferred to the transfer arm 136 via the interface unit 12, and for example, fifty wafers W are transferred to the first and second processing units 131 and 133 in sequence. Then, a predetermined liquid process is performed on the wafers W and the wafers W are transferred into the cleaning/drying unit 2 by the transfer arm 136.

Figure 5A:
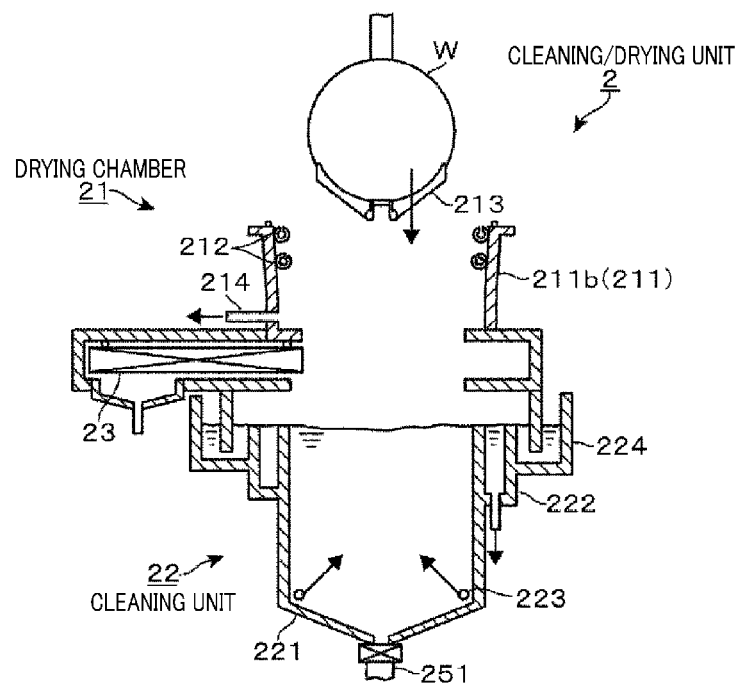
FIGS. 5A and 5B provide a first explanatory diagram showing an operation of the cleaning/drying unit.

When the wafer W is transferred into the cleaning/drying unit 2, as depicted in FIGS. 2 and 5A, the cover body 211a is moved upward to open the drying chamber main body 211 (illustration of the cover body 211a is omitted in FIG. 5A), the wafer boat 213 is moved upward to a transfer position and the wafer W is received by the wafer boat 213 from the transfer arm 136. At this time, the inner tank 221 of the cleaning unit 22 is filled with a cleaning solution such as DHF, and as shown by a flowchart of a supply of a cleaning solution in FIG. 7(c), the DHF is continuously supplied through the liquid supply nozzles 223, so that the cleaning solution overflows from the inner tank 221 to the outer tank 222 and is drained through the second liquid drain path 252. Further, gas exhaust is constantly performed through the gas exhaust line 214 during each operation of loading, cleaning, drying, and unloading the wafer W.

Figure 5B:
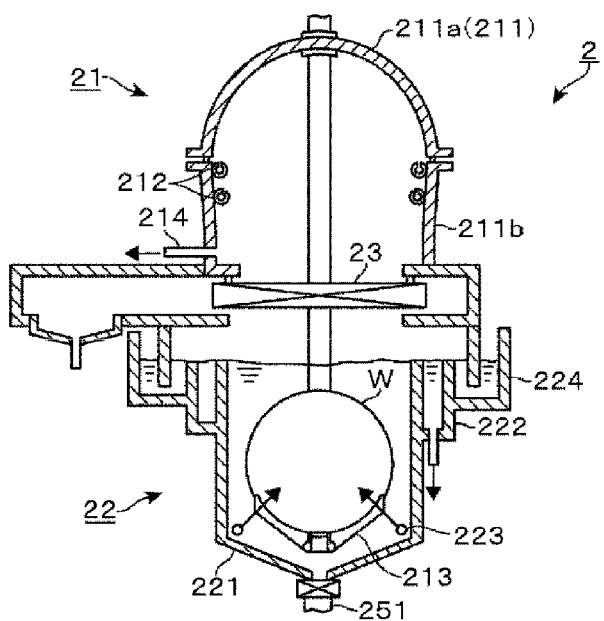

When the transfer arm 136 is retreated from the cleaning/drying unit 2 after the wafer W is transferred to the wafer boat 213 by the transfer arm 136, the shutter 23 is opened and the wafer boat 213 is moved downward to the cleaning position, so that a cleaning process is started by immersing the wafer W in the cleaning solution filled in the inner tank 221, as depicted in FIG. 5B. At the same time, the shutter 23 is closed and the cover body 211a is moved downward so as to airtightly seal the cleaning unit 22 and the drying chamber 21.

The DHF supplied through the liquid supply nozzles 223 flows on a surface of the wafer W immersed in the cleaning solution, so that a chemical oxide film formed on the surface of the wafer W is removed. Then, after the lapse of a predetermined time, as shown in FIG. 7(c), the cleaning solution in the inner tank 221 is changed by switching the cleaning solution supplied through the liquid supply nozzles 223 from the DHF to the DIW, and, thus, the DHF adhering to the wafer W is cleaned and the cleaning process to the wafer W is completed.

In this way, the cleaning process is performed on the wafer W by the DIW for a predetermined time period, and the shutter 23 is opened several minutes, for example, about 2 minutes to about 4 minutes before the cleaning process is completed. Thereafter, as depicted in FIGS. 7A and 7B, the drying chamber 21 and the upper region of the inner tank 221 are filled with a first drying gas, i.e., a mixed gas of IPA and nitrogen, supplied from the drying gas supply unit 3.

Figure 6A:
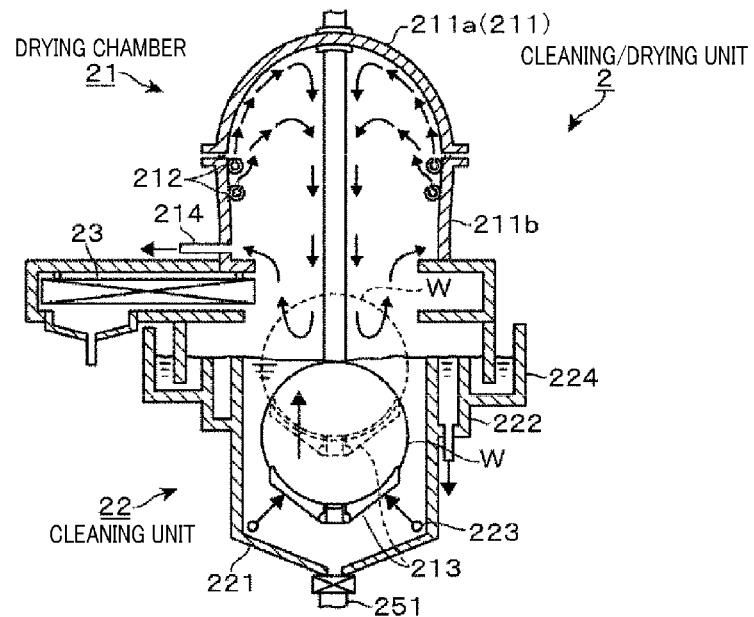
FIGS. 6A and 6B provide a second explanatory diagram showing an operation of the cleaning/drying unit.

The first drying gas is filled in an upper region of the cleaning tank, and the predetermined time for the cleaning process by the DIW passes by. Then, as depicted in FIG. 6A, the wafer boat 213 is moved upward, and the wafer W is picked up from the cleaning solution and delivered from the cleaning unit 22 to the drying chamber 21. At this time, a space where the wafer W is delivered is filled with the first drying gas including the IPA vapor and the nitrogen gas serving as a carrier gas, and, thus, if a pattern of, for example, a resist film is in contact with the first drying gas for a long time, the miniaturized pattern may be deformed into a taper pattern, a collapsed pattern, a disappeared pattern or dissolved pattern as described in the background of the invention. Meanwhile, if the wafer W is picked up to the space where the first drying gas is not supplied, the DIW on the surface of the wafer W may be dried during the delivery and water marks may be formed.

Thus, in the cleaning/drying unit 2 in accordance with the present embodiment, when the wafer W is moved upward by the wafer boat 213, the supply and stop of the supply of the IPA to the gas generation unit 33 is performed intermittently while a nitrogen gas is continuously supplied as depicted in FIGS. 7A and 7B. Accordingly, the moment the whole wafer W is immersed in the DIW, the first drying gas and the second drying gas are started to be supplied alternately, and after an upper end of the wafer W is picked up from a liquid surface of the cleaning solution, the first drying gas and the second drying gas are already supplied alternately into the upper region of the inner tank 221 and the drying chamber 21, i.e., a space where the wafer W being moved is exposed.

Herein, a state where the second drying gas does "not contain IPA vapor" may include not only a state where a concentration of IPA in the gas is about 0 but also a state where the supply of the IPA is substantially stopped. By way of example, after the supply of the IPA from the IPA supply system to the gas generation unit 33 is stopped, IPA remaining in the gas generation unit or the IPA vapor supply line 341 as a rear part is pushed out by a nitrogen gas and a drying gas is supplied into the drying chamber 21. Such a drying gas serves as the second drying gas which does "not contain IPA vapor."

As described above, by alternately supplying the first drying gas and the second drying gas, by way of example, while the first drying gas is supplied, the DIW from the surface of the wafer W is delivered to the IPA of the first drying gas, and then while the second drying gas is supplied, the IPA which delivers the water is volatilized from the surface of the wafer W. Thus, a concentration of the IPA on the surface of the wafer W can be kept low and generation of water marks due to evaporation of the water can be suppressed while the wafer W is picked up.

If a resist film for a KrF exposure is used, a supply time ratio of the first drying gas and the second drying gas may be set to be in a range of about 1:1 to about 1:10, for example, about 1:2. Further, by way of example, when the wafer W of, for example, about 300 mm is picked up from the cleaning solution, a lifting speed of the wafer boat 213 is set to be in a range of from about 2 mm/sec to about 10 mm/sec, for example, about 10 mm/sec and a cycle which is a time period required to supply the first drying gas and the second drying gas one time may be set to, for example, about 15 seconds. Herein, a supply time of the first drying gas is about 5 seconds and a supply time of the second drying gas is about 10 seconds.

As described above, when the lifting speed of the wafer boat 213 is set to about 10 mm/sec and the supply time of the first drying gas is set to about 5 seconds and the supply time of the second drying gas is set to about 10 seconds in one cycle, the first drying gas and the second drying gas are supplied alternately for about 30 seconds, for example, about two-cycle period, until the whole wafer W is picked up after a front end of the wafer W of about 300 mm is exposed to a drying gas atmosphere. Further, if a resist film for an ArF exposure is used, desirably, a supply time ratio of the first drying gas and the second drying gas may be set to be in a range of about 1:1 to about 1:10.

It may not be necessary to supply in advance the first drying gas into the drying chamber 21 and an atmosphere above the cleaning solution in the cleaning unit 22, for example, about 2 minutes to about 4 minutes before the wafer boat 213 is lifted upward. By way of example, both drying gases may be supplied alternately such that the first drying gas is first supplied and then the second drying gas is supplied when the wafer W is picked up.

Further, when the wafer W is picked up, in the cleaning unit 22, the DIW may be supplied through the liquid supply nozzles 223 toward the inner tank 221 in time for timing of supplying the first drying gas as depicted in FIG. 7(c). With this operation, while the first drying gas is supplied, the cleaning solution overflows from the inner tank 221 toward the outer tank 222, and, thus, IPA dissolved in the cleaning solution flows downward on the surface of the wafer W near a gas-liquid interface. Therefore, tapering or collapse of the resist film can be suppressed. Meanwhile, while the second drying gas is supplied, a supply of the cleaning solution is stopped, and, thus, a flow of the liquid is stopped and it is possible to prevent the DIW or minute particles contained in the liquid from adhering to the surface of the wafer again. Further, intermittent supplies of the DIW to the inner tank 221 are not limited to be performed at the exactly same time when the first drying gas is supplied. By way of example, the DIW may be supplied several seconds, for example, about 1 second to about 2 seconds in the present embodiment after the first drying gas is supplied. In this case, the supply of the DIW may be stopped at the same time when the supply of the first drying gas is stopped or may be stopped several seconds later.

Figure 6B:
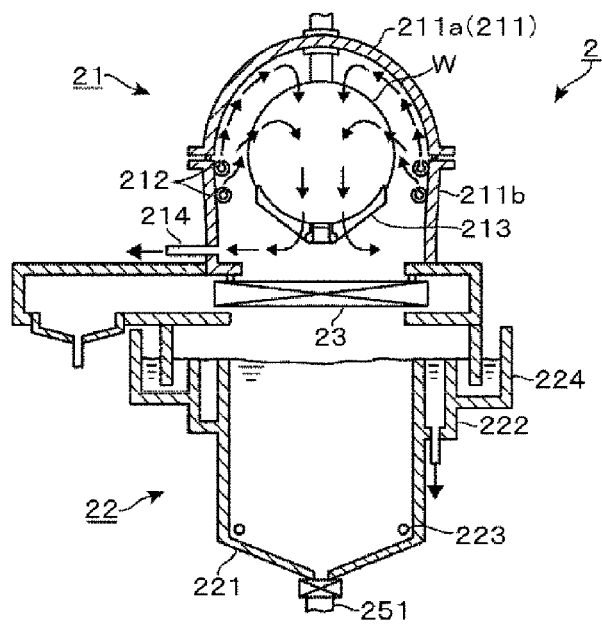

When the whole wafer W is picked up from the cleaning solution, the lifting speed of the wafer boat 213 may be increased to, for example, about 200 mm/sec and the wafer W is loaded into the drying chamber 21 and then the shutter 23 is closed to isolate the drying chamber 21 from the cleaning unit 22. In this case, as depicted in FIGS. 7A and 7B, the first drying gas and the second drying gas are supplied alternately through the drying gas supply nozzles 212 (FIG. 6B). The IPA vapor supplied into the drying chamber 21 flows upward along inner surfaces of both sidewalls of the drying chamber main body 211 and flows downward from a top area of the drying chamber main body 211, and then it is discharged to the outside through the gas exhaust line 214 as indicated by arrows in FIG. 6B. In the present embodiment, there has been explained a case where the lifting speed of the wafer boat 213 is increased to about 200 mm/sec in order to reduce a processing time, but even after the whole wafer W is picked up from the cleaning solution, the wafer boat 213 may be lifted upward at a speed in the above-described range of from about 2 mm/sec to about 10 mm/sec.

During this operation, the delivery of the DIW to the surface of the wafer W by the IPA of the first drying gas is performed alternately with the volatilization of the IPA which delivers the water from the surface of the wafer W. Consequently, a drying process can be performed on the wafer W while reducing effects of the IPA on the resist film and suppressing generation of water marks.

Further, since the supply of the IPA to the surface of the wafer W is performed alternately with the volatilization of the IPA, a concentration of the IPA on the surface of the wafer W can be suppressed to be low and condensation of the IPA on the surface of the wafer W can be suppressed. Accordingly, even if the wafer W is picked up from the cleaning solution in a longitudinal direction, it is difficult to form a liquid film of the IPA. Therefore, even after the wafer W is cleaned, downflow of particles due to a downward flow of the IPA from a periphery area where relatively many particles remain can be suppressed, so that it is possible to prevent contamination of a central area maintained in a clean state after the cleaning process.

Further, the first drying gas and the second drying gas may be supplied alternately before the wafer W is picked up. Accordingly, the concentration of the IPA vapor is suppressed to be low, and, thus, it is more difficult to form a liquid film of the IPA on the surface of the wafer W. Even if the liquid film is formed, it can be made very thin and downflow of particles can be suppressed.

In this way, after the drying process is performed for a predetermined time while the first drying gas and the second drying gas are supplied alternately, the supply of the drying gas into the drying chamber 21 is stopped and the drying chamber 21 is filled with, for example, a nitrogen gas of a normal temperature. Then, the cover body 211a of the drying chamber main body 211 is moved upward, and the wafer W is delivered from the wafer boat 213 to the transfer arm 136. Then, the wafer W is accommodated in the FOUP 7 via the second interface room 120b. The FOUP 7 is taken out from the loading/unloading unit 11 and delivered to an external transfer robot to be forwarded to the next process. In the wafer cleaning system 1 in accordance with the present embodiment, the above-described operations are consecutively carried out, and several hundreds of wafers W may be processed in an hour.

The cleaning/drying unit 2 in accordance with the present embodiment has effects as described below. After the wafer W is cleaned, the cleaning solution is dried by alternately supplying the first drying gas containing the IPA vapor for removing a liquid and the second drying gas without containing the IPA vapor to the area where the wafer picked up from the cleaning solution is exposed. Accordingly, removal of the water from the surface of the wafer W by the IPA vapor can be performed alternately with the evaporation of the IPA. Consequently, a concentration of a solvent on the surface of the wafer W becomes low, and, thus, generation of water marks can be reduced while suppressing effects on a pattern formed on the surface of the wafer W.

Referring to FIG. 3, there has been explained the cleaning/drying unit 2 in which the drying chamber 21 and the cleaning unit 22 (inner tank 221) are vertically stacked. However, the drying chamber 21 and the cleaning unit 22 may be arranged, for example, in a horizontal direction. In this case, if the upper region of the inner tank 221 communicates with the drying chamber 21 and the wafer W picked up from the cleaning solution is delivered to the drying chamber 21 passing through the communicated space, it is possible to obtain the same operation and effects of the cleaning/drying unit 2 as described above. That is, from a period of a delivery of the wafer W to a period of a dry process in the drying chamber 21, the first drying gas containing the IPA vapor and the second drying gas without containing the IPA vapor are supplied to the area where the wafer W is exposed, and, thus, the wafer W can be dried while reducing effects on a pattern made of a material including an organic material such as a resist film and suppressing generation of water marks.

The pattern made of the material including the organic material to which the present disclosure is applicable is not limited to the resist film. By way of example, it is possible to perform a drying process on a wafer W provided with an organic film used in, e.g., a dual damascene process while suppressing generation of water marks and reducing effects on a pattern formed of the organic film.

Further, the solvent to which the present disclosure is applicable is not limited to the IPA, and vapor of other solvents may be used as long as the process can proceed successfully. Furthermore, other liquids than the DIW can be used as the cleaning solution.

In FIG. 7(c), while the wafer W is picked up, when the first drying gas and the second drying gas are supplied alternately, the DIW is supplied intermittently to the inner tank 221 at the same time when the first drying gas containing the IPA vapor is supplied. However, a sequence of supplying the DIW is not limited thereto. By way of example, while the wafer W is picked up, the first drying gas and the second drying gas may be supplied alternately and the DIW may be continuously supplied. Even though the DIW is continuously supplied, the cleaning solution overflows from the inner tank 221 toward the outer tank 222, so that tapering or collapse of the resist film can be suppressed by reducing a concentration of the IPA in the DIW. Further, a thin liquid film of the IPA is formed on the surface of the wafer W, and, thus, downflow of particles can be suppressed.

Regarding the timing for supplying the first drying gas and the DIW while the wafer W is picked up, if the DIW is supplied based on a supply of the first drying gas, which is within a scope of the present disclosure. As described above, by way of example, the DIW may be supplied before or after the supply of the first drying gas, or the DIW may be supplied while the supply of the first drying gas is stopped, i.e., while the second drying gas is supplied. In these cases, it is possible to obtain the above-described effect caused by overflow of the DIW from the inner tank 221 as compared to a case where the DIW is not supplied.

Further, in the present embodiment, the first drying gas and the second drying gas are supplied from the common drying gas supply unit 3, but it may be possible to provide another drying gas supply unit to separately supply these gases. By way of example, it may be possible to provide a gas supply unit for supplying the first and second drying gases to the upper region of the inner tank 221 and another gas supply unit for supplying the first and second drying gases to the drying chamber 21. In this case, the drying gas supply unit for supplying the first drying gas to the upper region of the inner tank 221 and the drying chamber 21 may serve as a first drying gas supply unit and the drying gas supply unit fort supplying the second drying gas to the upper region of the inner tank 221 and the drying chamber 21 may serve as a second drying gas supply unit.

Hereinafter, a substrate processing method in accordance with a second embodiment will be explained. The substrate processing method in accordance with the second embodiment can be performed by the cleaning/drying unit 2 illustrated in FIGS. 3 and 5A to 6B and the drying gas supply unit 3 illustrated in FIG. 4. Therefore, the same components as those of the cleaning/drying unit 2 or the drying gas supply unit 3 in accordance with the first embodiment will be assigned same reference numerals as shown in these drawings.

In the same manner as the cleaning/drying unit 2 in accordance with the first embodiment, a cleaning/drying unit in accordance with the second embodiment supplies a gas containing IPA vapor (solvent vapor) to an area of a drying chamber 21 to which a wafer W picked up from a cleaning solution after a cleaning process is delivered. However, the second embodiment is different from the first embodiment in that a concentration of the solvent of the gas supplied to the area is high enough to form a liquid film on a surface of the wafer W. Further, the second embodiment is different from the first embodiment in that when a drying process is performed on the wafer W delivered to the drying chamber 21, there is supplied IPA vapor having a higher concentration than that of IPA vapor supplied when the wafer W is picked up.

Figure 8:
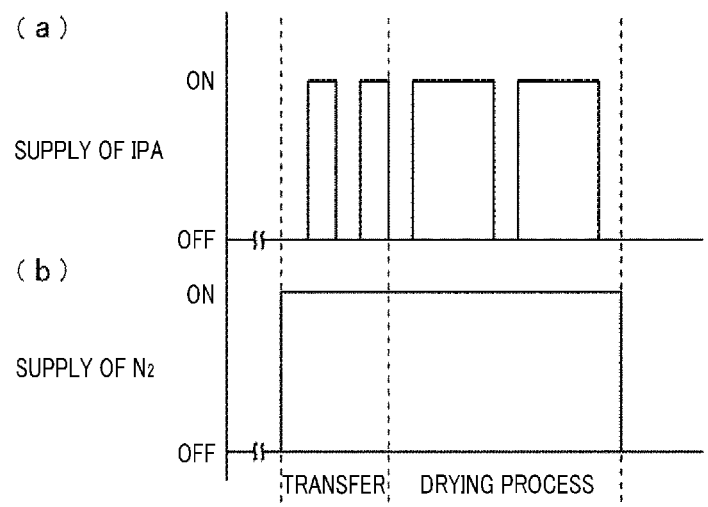
FIG. 8 shows a sequence of a first gas supply process in accordance with a second embodiment.

By way of example, in the cleaning/drying unit 2 in accordance with the second embodiment, when the wafer is picked up from the cleaning solution as depicted in FIG. 6A after a cleaning process (FIG. 5B), supply and stop of the supply of IPA into a gas generation unit 33 is intermittently supplied or stopped while a nitrogen gas is continuously supplied (see flowcharts of a supply in FIGS. 8A and 8B). Consequently, after an upper end of the wafer W is picked up from a liquid surface of the cleaning solution, a gas containing the IPA vapor and another gas without containing the IPA vapor are supplied alternately into an upper region of an inner tank 221 and the drying chamber 21, i.e., a space where the wafer W being moved is exposed. This operation is the same as described in the first embodiment shown in FIGS. 7A and 7B.

In the present embodiment, an average concentration (first concentration) of the IPA vapor (first gas) of the gas supplied to the space where the wafer W is exposed is maintained such that a thin liquid film can be formed on the surface of the wafer W by the cleaning solution adhering to the wafer W or the IPA vapor dissolved in the cleaning solution. However, the liquid film formed on the surface of the wafer W needs to be thin enough not to flow down in order to prevent contamination of the wafer W as described in the background of the invention.

By forming the thin liquid film containing the IPA on the surface, the wafer W can be transferred to the drying chamber 21 while suppressing generation of water marks. In other words, the gas of the first concentration is used to allow the liquid film to remain on the surface without drying the surface of the wafer W while the wafer W is transferred to the drying chamber 21, and the concentration is adjusted in a range of about 150 volumetric ppm to about 250 volumetric ppm, for example, to about 200 volumetric ppm.

Thereafter, when the wafer W is loaded into the drying chamber 21 as described above and the shutter 23 is closed as depicted in FIG. 6B, an average concentration of the IPA vapor (second gas) supplied into the drying chamber is adjusted in a range of about 250 volumetric ppm to about 400 volumetric ppm, for example, to about 300 volumetric ppm (second concentration) higher than the first concentration. Consequently, the IPA is condensed on the surface of the wafer W, and, thus, a concentration of the cleaning solution in the liquid film is decreased. Then, after the lapse of a predetermined time, when the supply of the IPA vapor is stopped and the inside of the drying chamber 21 is continuously evacuated, the IPA containing the cleaning solution of a low concentration is evaporated. Therefore, the wafer W can be dried without generating water marks. Since the wafer W loaded into the drying chamber 21 is in a stationary state, even though a liquid film formed on the surface of the wafer W becomes thick by supplying IPA vapor of a higher concentration than IPA vapor when the wafer W is moved, it is difficult for the liquid film to flow down.

In a liquid processing method in accordance with the second embodiment, while the wafer W is moved, a thin liquid film can be formed on the surface of the wafer W by supplying the first gas containing IPA vapor of the relatively low concentration (first concentration). Accordingly, contamination of the wafer W or generation of water marks can be suppressed while preventing the liquid film from flowing down and preventing the surface of the wafer W from being dried. Further, after the wafer W is loaded into the drying chamber 21, the second gas containing IPA vapor of the concentration (second concentration) higher than the first concentration is supplied, and, thus, a greater amount of IPA than IPA supplied when the wafer W is moved is condensed on the surface of the wafer W. Therefore, it is possible to dilute the cleaning solution adhering to the surface of the wafer W and then the IPA is evaporated, so that the cleaning solution adhering to the surface of the wafer W can be removed while preventing generation of water marks.

The concentration (first concentration) of the IPA of the first gas varies depending on materials or a pattern shape on the surface of the wafer W and is not limited to the above-described range (i.e., from about 150 volumetric ppm to about 250 volumetric ppm). Another concentration can be used if it is possible to form a liquid film thin enough not to flow on the surface of the wafer W which is picked up from the cleaning solution and transferred to the drying chamber 21. An upper limit of the first concentration can be determined from a concentration immediately before contamination of the wafer W caused by the liquid film flowing down can be seen by repeatedly performing a preliminary experiment in which the wafer W is dried while a concentration of IPA vapor is gradually increased. Likewise, a lower limit of the first concentration can be determined from a concentration immediately before water marks beyond a tolerance limit are generated by repeatedly performing a preliminary experiment in which the wafer W is dried while the concentration of the IPA vapor is gradually decreased.

Meanwhile, a lower limit of the concentration (second concentration) of the IPA of the second gas is defined by the first concentration, and used as an upper limit thereof is a concentration immediately before contamination of the wafer W caused by the liquid film flowing down can be seen by repeatedly performing a preliminary experiment in which the liquid film is condensed in the drying chamber 21. Therefore, the second concentration is not limited to the above-described range (i.e., from about 250 volumetric ppm to about 400 volumetric ppm).

Figure 9:
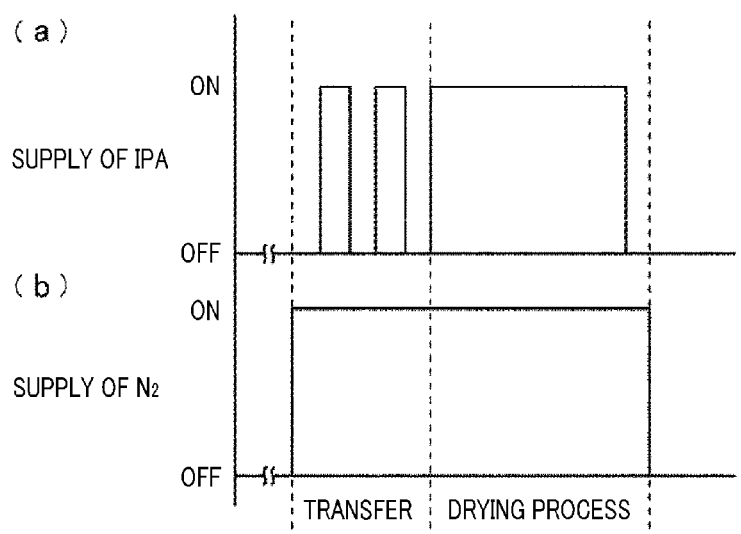
FIG. 9 is a modification example of a sequence of the first gas supply process.

A method of changing a concentration of IPA vapor from a first concentration to a second concentration is not limited to a case where if a gas containing IPA vapor and a gas without containing the IPA vapor are alternately supplied intermittently, a supply time of the IPA vapor is increased as depicted in FIGS. 8A and 8B. Contrary to the case shown in FIG. 8(a), a stoppage time of the IPA may be decreased, or as depicted in FIGS. 9(a) and 9(b), after the wafer W is loaded into the drying chamber 21, the intermittent supply of the IPA vapor is changed to a continuous supply to obtain the second concentration.

Figure 10:
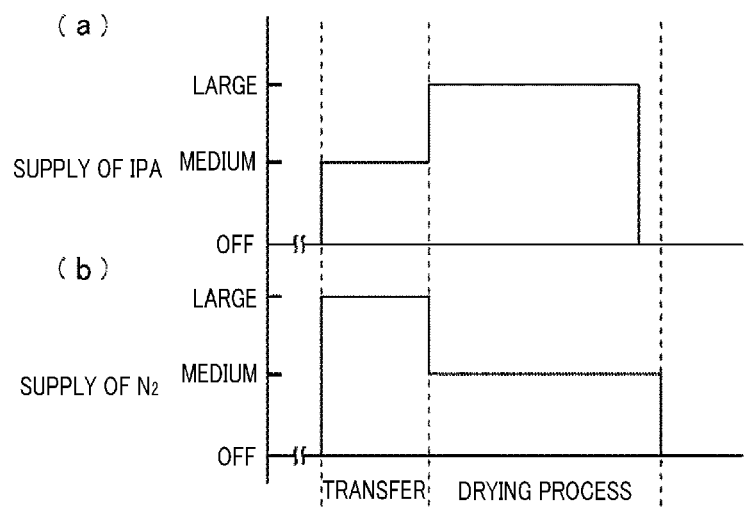
FIG. 10 shows a sequence of a second gas supply process.

Further, by way of example, as depicted in FIGS. 10(a) and 10(b), IPA vapor and a nitrogen gas as a dilution gas are continuously supplied to change a mixing ratio thereof. In this way, a concentration of the IPA vapor can be changed from the first concentration to the second concentration.

Figure 11:
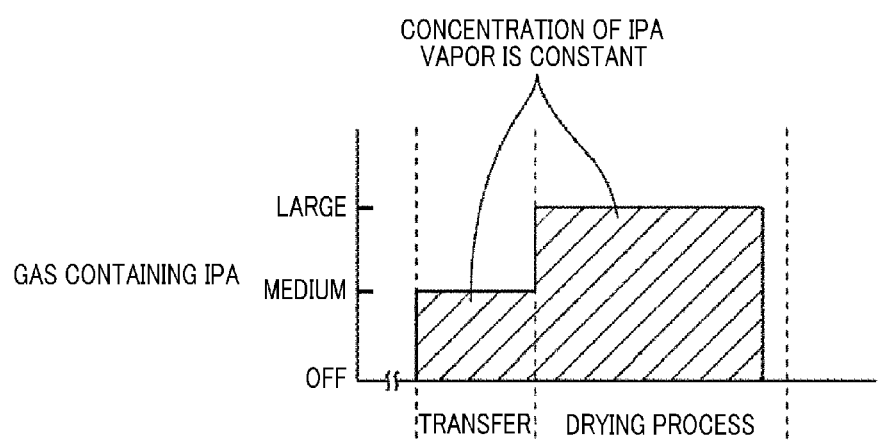
FIG. 11 shows a sequence of a third gas supply process.

Otherwise, by way of example, if IPA vapor is generated by making bubbles of a carrier gas such as a nitrogen gas in a liquid IPA instead of using the drying gas supply unit 3 illustrated in FIG. 4, a saturated vapor amount of the IPA is defined depending on a temperature of the carrier gas at the time of making bubbles and a concentration of the IPA may become nearly constant. In this case, as depicted in FIG. 11, by increasing a gas supply amount at the time of performing a drying process in the drying chamber 21 with respect to a gas supply amount at the time of moving the wafer W, the concentration of the IPA vapor can be changed. By way of example, if a gas exhaust amount from the gas exhaust line 214 is constant at the time of moving the wafer W and at the time of performing the drying process, by increasing the gas supply amount, a voltage in the system is increased and also a partial pressure of the IPA is increased. Thus, an actual concentration of the IPA supplied to the surface of the wafer W becomes increased.

In the above-described embodiments, there has been explained a case where the wafer W is picked up to the drying chamber 21, but it may be possible to discharge a rinse solution in the cleaning tank (inner tank 221) and supply IPA vapor into the cleaning tank instead of moving the wafer W to the drying chamber 21.

EXPERIMENTAL EXAMPLE

Experiment 1

With respect to the substrate process in accordance with the first embodiment explained with reference to FIGS. 1 to 7, an effect on a wafer W on which a resist film is formed has been studied by changing the kind of a drying gas and a method of supplying the drying gas.

A. Experimental Conditions cleaning and drying processes are performed on a 300 mm wafer W on which a trench pattern 80 made of a KrF resist film is formed by a cleaning/drying unit 2 depicted in FIG. 3, and then removability of particles, an effect on a resist, generation of water marks, and downflow of particles have been observed.

Experimental Example 1-1

Based on a sequence of a supply of a drying gas and a cleaning solution described in FIGS. 7A to 7C, cleaning and drying processes have been performed on a wafer. Here, unlike FIG. 7(c), while the wafer W is picked up (moved), a supply of the cleaning solution is stopped and an intermittent supply of the cleaning solution is not performed.

First drying gas: about 120 liter per minute of nitrogen and about 0.2 cc per second of IPA vapor (concentration of IPA: about 100 volumetric ppm)

Second drying gas: about 120 liter per minute of nitrogen

Supply time in one cycle: First drying gas supply time of about 5 seconds and second drying gas supply time of about 10 seconds (a total of 16 cycles including a pick-up time have been performed)

Pick-up speed of a wafer W: about 10 mm/sec

Comparative Example

Unlike the experimental example 1-1, only a first drying gas is continuously supplied. A wafer W is picked up under an atmosphere of the first drying gas at a speed of about 50 mm/sec. Then, a shutter 23 is closed and a drying process is performed on the wafer W in a drying chamber 21 for about 90 seconds while continuously supplying the first drying gas.

Comparative Example 1-2

Unlike the experimental example 1-1, only a second drying gas is continuously supplied. A wafer W is picked up under an atmosphere of the second drying gas at a speed of about 50 mm/sec. Then, a shutter 23 is closed and a drying process is performed on the wafer W in a drying chamber 21 for about 1200 seconds while continuously supplying the first drying gas.

B. Experimental Data

Table 1 shows experimental data obtained from an evaluation of the above-described experimental example and comparative examples on evaluation items as follows.

TABLE 1

| | Removing particles | Effect on resist | Water marks | Downflow of particles | General evaluation |
|---|---|---|---|---|---|
| Experimental example 1-1 (Intermittent supply of IPA) | Favorable | Negative | Favorable | Negative | ◯ |
| Experimental example 1-1 (Continuous supply of IPA) | Favorable | Positive | Favorable | Positive | X |
| Comparative example 1-2 (Only $N_2$) | Slightly favorable | Negative | Poor | Negative | X |

According to the experimental data shown in Table 1, in the experimental example 1-1 where the first drying gas and the second drying gas are supplied alternately, it has been observed that removability of particles is favorable and particles do not adhere again after a cleaning process. Further, it has not been observed that a resist pattern is tapered, collapsed, dissolved or disappears, and water marks are generated in a target range. Furthermore, it has not been observed that particles in a peripheral area flow down. In view of this fact, as a general evaluation, it is deemed that cleaning and drying processes in which the first drying gas and the second drying gas are supplied alternately have little effect on the resist pattern and make it possible to obtain a favorable cleaning result.

On the contrary, in the comparative example 1-1 where the first drying gas is continuously supplied, it has been observed that a resist pattern is collapsed and particles in a peripheral area flow down. Further, in the comparative example 1-2 where only the second drying gas is continuously supplied, water marks are generated since IPA is not supplied. In view of this result, it can be seen that a process in accordance with the experimental example 1-1 where the first drying gas and the second drying gas are supplied alternately is effective.

Experiment 2

A mixing amount of IPA vapor in a first drying gas is changed, and an effect on a resist pattern has been checked.
A. Experimental Conditions Experimental Example 2-1

An experiment has been conducted under the same conditions as in the experimental example 1-1.

Experimental Example 2-2

An experiment has been conducted under the same conditions as in the experimental example 1-1 except that a mixing amount of IPA vapor is about 0.4 cc/sec (concentration of IPA: about 200 volumetric ppm).

Experimental Example 2-3

An experiment has been conducted under the same conditions as in the experimental example 1-1 except that a mixing amount of IPA vapor is about 0.6 cc/sec (concentration of IPA: about 300 volumetric ppm).

Experimental Example 2-4

An experiment has been conducted under the same conditions as in the experimental example 1-1 except that a mixing amount of IPA vapor is about 0.8 cc/sec (concentration of IPA: about 400 volumetric ppm).
Table 2 shows data of an effect on a resist pattern in each experimental example as follows.

TABLE 2

|  | Processed resist pattern |
| --- | --- |
| Experimental example 2-1 | Favorable |
| Experimental example 2-2 | Favorable |
| Experimental example 2-3 | Slightly favorable |
| Experimental example 2-4 | Slightly favorable |

According to the results of the experimental examples 2-1 to 2-4, it has not been observed that a resist pattern is collapsed or disappears. However, it has been observed that as a concentration of IPA vapor is increased, the resist pattern is gradually dissolved. Evaluated from this viewpoint, it is possible to obtain a result that the experimental examples 2-1 and 2-2 where a supply amount of IPA vapor is in a range of from about 0.2 cc/sec to about 0.4 cc/sec (concentration of IPA ranging from about 100 volumetric ppm to about 200 volumetric ppm) are more desirable since a degree of dissolution of the resist pattern is low in these experimental examples.

Experiment 3

A lifting speed of a wafer boat 213 (pick-up speed of a wafer W) is changed, and an effect on generation of water marks has been evaluated.
A. Experimental Conditions Experimental Example 3-1

An experiment has been conducted under the same conditions as in the experimental example 1-1.

Experimental Example 3-2

Figure 12:
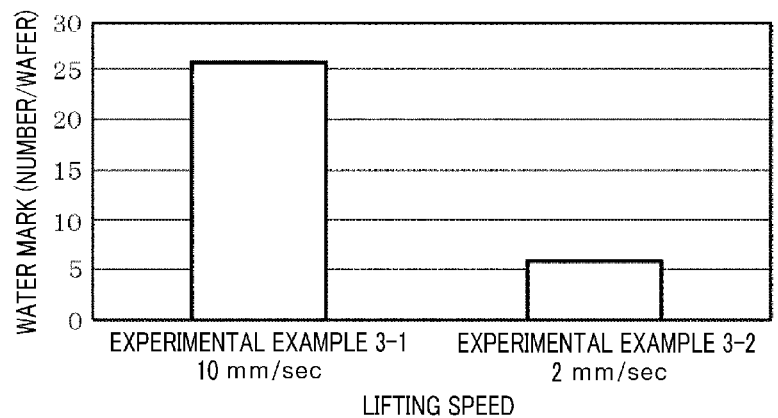
FIG. 12 is an explanatory diagram showing results of experimental examples.
Figure 13A:
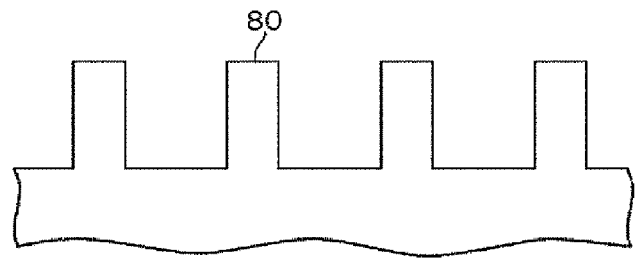
FIGS. 13A and 13B provide a schematic diagram of a pattern formed on a surface of a wafer.
Figure 13B:
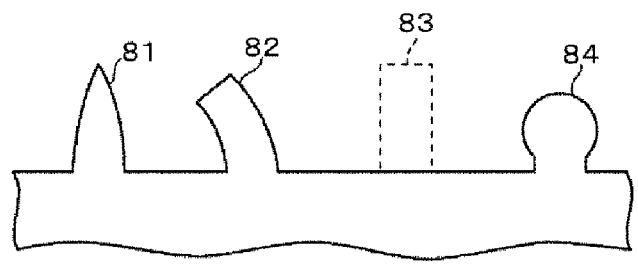

An experiment has been conducted under the same conditions as in the experimental example 1-1 excepting that a lifting speed of a wafer boat 213 is about 2 mm/sec).
B. Experimental Data
FIG. 12 shows generation of water marks in each experimental example. According to the result of the experimental examples 3-1 and 3-2, when the lifting speed of the wafer boat 213, i.e., the speed of picking up the wafer W from a cleaning solution is reduced, a generation amount of water marks is decreased. That is because by reducing the pick-up speed of the wafer W, there is an increase in the number of cycles in which a first drying gas and a second drying gas are supplied until the whole wafer W is picked up from the cleaning solution after a front end of the wafer W is exposed to a drying gas atmosphere, and, thus, the wafer W is picked up under a condition where water marks are difficult to generate.

What is claimed is:

1. A substrate processing method comprising:
cleaning a target substrate by immersing the target substrate in a cleaning solution in a longitudinal direction while the cleaning solution is supplied to a cleaning tank;
transferring the target substrate picked up from the cleaning tank to a drying chamber while holding the target substrate in a longitudinal direction;
during the step of transferring, alternately supplying a first drying gas containing vapor of a solvent for removing a liquid and a second drying gas not containing the vapor of the solvent for removing the liquid to an area where the target substrate is exposed between an upper area of the cleaning tank and the drying chamber after an upper end of the cleaned target substrate is picked up from a liquid surface of the cleaning solution; and
drying the target substrate in the drying chamber communicating with the upper area of the cleaning tank,
wherein, when a cycle is defined as a period of time required to respectively supply the first drying gas and the second drying gas one time, at least one cycle is repeated between a time when the upper end of the target substrate is picked up from the cleaning solution and a time when the whole target substrate is picked up from the cleaning solution.

2. The substrate processing method of claim 1, further comprising:
supplying the first drying gas and the second drying gas alternately to the upper area of the cleaning tank from a time when the entire target substrate is immersed in the cleaning solution.

3. The substrate processing method of claim 1, further comprising:
supplying a cleaning solution into the cleaning tank based on an operation of supplying the first drying gas to the upper area of the cleaning tank.

4. The substrate processing method of claim 1, wherein a speed of picking up the target substrate from the cleaning solution is in a range of from about 2 mm/sec to about 10 mm/sec.

5. The substrate processing method of claim 1, wherein a resist pattern for a KrF excimer laser exposure is formed on the target substrate, and the first drying gas is a mixed gas containing isopropyl alcohol of a concentration ranging from about 60 volumetric ppm to about 240 volumetric ppm in a nitrogen gas as a carrier gas at standard temperature and standard pressure, and the second drying gas is a nitrogen gas.

6. The substrate processing method of claim 5, wherein a supply time ratio of the first drying gas and the second drying gas is in a range of from about 1:1 to about 1:10.

7. The substrate processing method of claim 5, wherein a supply amount of the nitrogen gas is in a range of from about 100 liters/min to about 200 liters/min at standard temperature and pressure.

8. A substrate processing method comprising:
cleaning a target substrate by immersing the target substrate in a cleaning solution in a longitudinal direction while the cleaning solution is supplied to a cleaning tank;
transferring the target substrate picked up from the cleaning tank to a drying chamber while holding the target substrate in a longitudinal direction;
during the step of transferring, supplying a first gas containing vapor of a solvent of a first concentration to an area where the target substrate is exposed between an upper area of the cleaning tank and the drying chamber in order to form a liquid film on a surface of the target substrate after an upper end of the cleaned target substrate is picked up from a liquid surface of the cleaning solution; and,
supplying a second gas containing the vapor of the solvent of a second concentration higher than the first concentration after the target substrate is loaded into the drying chamber communicating with the upper area of the cleaning tank in order to remove the liquid by vaporizing the solvent after the liquid adhering to the surface of the substrate is diluted by condensing the solvent,
wherein, when a cycle is defined as a period of time required to supply the first gas one time, at least one cycle is repeated between a time when the upper end of the target substrate is picked up from the cleaning solution and a time when the whole target substrate is picked up from the cleaning solution.

9. The substrate processing method of claim 8, wherein in the supplying process of the first gas and the supplying process of the second gas, the first concentration is changed to the second concentration by changing an interval of alternate supplies of a gas containing the vapor of the solvent and a gas not containing the vapor of the solvent.

10. The substrate processing method of claim 8, wherein the first concentration is changed to the second concentration by changing an interval of alternate supplies of a gas containing the vapor of the solvent and a gas not containing the vapor of the solvent in the step of supplying the first gas and continuously supplying a gas containing the vapor of the solvent in the step of supplying the second gas.

11. The substrate processing method of claim 8, wherein in the supplying process of the first gas and the supplying process of the second gas, the first concentration is changed to the second concentration by changing a mixing ratio of the vapor of the solvent and a gas that dilutes the vapor of the solvent.

12. The substrate processing method of claim 8, wherein in the supplying process of the first gas and the supplying process of the second gas, the first concentration is changed to the second concentration by changing a supply amount of a gas containing vapor of a solvent of a preset concentration.

13. A storage medium configured to store a computer program used in a substrate processing apparatus that cleans a target substrate by immersing the target substrate in a cleaning solution in a cleaning tank and dries the target substrate after transferring the target substrate to a drying chamber,
wherein the program includes steps to perform a substrate processing method as claimed in claim 1.

* * * * *

UNITED STATES PATENT AND TRADEMARK OFFICE
CERTIFICATE OF CORRECTION

| | |
|---|---|
| PATENT NO. | : 8,778,092 B2 |
| APPLICATION NO. | : 13/042645 |
| DATED | : July 15, 2014 |
| INVENTOR(S) | : Hiroshi Tanaka |

It is certified that error appears in the above-identified patent and that said Letters Patent is hereby corrected as shown below:

In the Specification

Column 15, line 23, add - 2 - between "unit" and "in"

Column 16, line 6, add - 21 - between "chamber" and "is"

Signed and Sealed this
Twenty-first Day of October, 2014

Michelle K. Lee
*Deputy Director of the United States Patent and Trademark Office*